United States Patent

Poutasse et al.

[11] Patent Number: 5,614,324
[45] Date of Patent: Mar. 25, 1997

[54] MULTI-LAYER STRUCTURES CONTAINING A SILANE ADHESION PROMOTING LAYER

[75] Inventors: Charles A. Poutasse, Beachwood; Richard L. Luthy, Beverly, both of Ohio

[73] Assignee: Gould Electronics Inc., Eastlake, Ohio

[21] Appl. No.: 505,741

[22] Filed: Jul. 24, 1995

[51] Int. Cl.$^6$ .................................................. B32B 27/04
[52] U.S. Cl. ........................................ 428/447; 442/232
[58] Field of Search ............................................. 428/447

[56]  References Cited

U.S. PATENT DOCUMENTS

| | | | |
|---|---|---|---|
| 3,508,983 | 4/1970 | Origer et al. .............................. | 156/3 |
| 3,708,458 | 1/1973 | Alberino et al. ......................... | 528/222 |
| 4,624,978 | 11/1986 | Frayer ..................................... | 524/600 |
| 4,732,858 | 3/1988 | Brewer et al. ........................... | 437/228 |
| 4,797,307 | 1/1989 | Kunimoto et al. ...................... | 428/447 |
| 4,902,731 | 2/1990 | Leibfried ................................. | 523/222 |
| 4,910,077 | 3/1990 | Benedikt .................................. | 428/251 |
| 4,923,678 | 5/1990 | Benedikt et al. ........................ | 428/209 |
| 5,061,550 | 10/1991 | Shimizu et al. ........................ | 428/457 |
| 5,114,757 | 5/1992 | Linde et al. ............................. | 427/387 |
| 5,145,937 | 9/1992 | Hergenrother et al. ................. | 528/353 |
| 5,189,128 | 2/1993 | Maw et al. .............................. | 526/262 |
| 5,227,244 | 7/1993 | Milligan ................................. | 428/458 |

OTHER PUBLICATIONS

Chin et al, "Polyimide Technology to Meet the Packaging Needs of the 90's", Ciba–Geigy Corporation, Polymers Division, Product Bulletin.

"Araldite XU 8292 NPM 60–1, High Performance Bismaleimide Laminating Resin", Ciba–Geigy Corporation, Product Bulletin.

"Sycar Resins, The New High–Performance Solution for Demanding Electronic Applications", Hercules Incorporated, Wilmington, Delaware, Product Bulletin.

*Primary Examiner*—Robert E. Sellers
*Attorney, Agent, or Firm*—Michael A. Centanni

[57]  ABSTRACT

A multi-layer structure utilized in the preparation of printed circuit boards comprises a metal foil layer, a prepreg layer containing a resin possessing carbon-carbon double bonds such as a polyimide, a polyester or a silicon-carbon resin, and an adhesion promoting layer of a non-epoxy group-containing hydrolyzable silane possessing a heterocyclic such as an imidazole or pyrrole; acryloxy, amide or a carbon-carbon double bond-containing group such as styryl.

20 Claims, No Drawings

MULTI-LAYER STRUCTURES CONTAINING A SILANE ADHESION PROMOTING LAYER

FIELD OF THE INVENTION

The present invention relates to multi-layer structures containing an adhesion promoting layer of a silane. More specifically, the present invention relates to multi-layer structures containing a prepreg layer made from a resin curable via a carbon carbon double bond curing mechanism and an adhesion promoting layer containing a silane defined by chemical formula.

BACKGROUND OF THE INVENTION

Printed circuit boards may be used as components in electronic devices. PCBs may be made from multi-layer structures which typically comprise a conductive foil, such as copper foil, and a polymeric resin substrate. The conductive foil forms conductors while the polymeric resin substrate provides structural integrity and forms an insulation between the conductors. Since the conductor and insulator are in intimate contact, adhesion between the two contributes to the performance and reliability of the electronic devices made with them.

Electrodeposited and wrought or rolled copper foils used in the manufacture of printed circuit boards do not adhere well to the polymeric substrates. The prior practice for achieving adhesion between copper foil and insulating polymeric substrates has been to roughen the copper surface.

Surface roughening has been achieved by several means. The electrodeposited copper foils can be electroformed with a rough surface. On top of this rough surface further roughening is carried out by applying a high surface area treatment. These treatments may be a copper deposited electrolytically in nodular or powder form, or a copper oxide which grows nodular or dendritic, among others. Often times the rolled copper foil has mechanical roughness imparted to it during rolling or by subsequent abrasion. The rolled foils also are conventionally treated with surface area increasing nodular copper or copper oxide treatments.

These surface roughening treatments increase adhesion to the polymers by forming a mechanical interlock with the resin. The mechanical interlock is formed when an adhesive in its liquid state is applied and then cured or when the resin melts and flows prior to cure during lamination. The polymers flow around the roughened surface area treatments to form the mechanical interlock.

There are several factors contributing to the adhesion measured between the copper foil and the polymeric resin. Some of these are surface area, type of roughness, wettability, chemical bond formation, type of chemical bond, formation of interpenetrating networks, and properties of the adhering materials.

During an adhesion test the interlocked resin and copper often adhere well enough that failure occurs within the resin, a cohesive failure. With some resins the mechanical interlocking of treatment and resin does not result in the desired high adhesion and failure occurs at the interface between resin and copper, an adhesive failure.

Various different prepregs have been used to make the polymeric resin substrate. When an epoxy or polyimide prepreg is used, an adhesion promoting layer containing an epoxy silane has demonstrated satisfactory adhesive characteristics. For example, γ-glycidylpropyltrimethoxysilane as a 0.5 percent by volume solution in water has been used with some success.

In general, the effectiveness of coatings in bonding dielectric substrates to metal foils depends upon the compatibility of the coatings with the foil and substrate. Since different foils and/or substrates may be used in a given multi-layer structure, it is necessary to determine compatible substrate-foil-adhesive combinations.

Polyimide resins have been used for the polymeric resin substrate because of their thermal properties. In fact, polyimide resins are used frequently because they possess high reliability for extended periods of time. More specifically, upon comparing polyimide resins and epoxy resins, polyimide resins exhibit higher glass transition temperatures and lower coefficients of thermal expansion. As a result, PCBs made with polyimide resins have reduced barrel cracking, improved pad repairability, and high reliability for high density circuit boards. One commonly used polyimide resin is derived from a bismaleimide of maleic anhydride and methylene dianiline (BMI/MDA). However, MDA is a suspected carcinogen and, accordingly, a number of problems are associated with its use. Since BMI/MDA polyimide resins are extensively used, adhesives compatible with BMI/MDA polyimide resins are likewise extensively used.

Recently, new prepreg resin systems have been introduced into the market place. Conventional adhesive systems heretofore used with BMI/MDA polyimide resins, epoxy resins, or any other conventional resins for that matter are not necessarily compatible with the new prepreg resin systems reaching the market place. Therefore, it is desirable to provide adhesives for use in multi-layer structures which can effectively bond conductive foils with the new prepreg resin systems described above. It is desirable that the adhesives display capability via strong adhesion to both the conductive foils and the new polyimide resins while simultaneously displaying high temperature stability.

SUMMARY OF THE INVENTION

The present invention relates to the discovery of compatible layers of a multi-layer structure. The multi-layer structures may contain a prepreg layer in which the curing of the prepreg resin takes place by reaction of a carbon carbon double bond.

In one embodiment, the present invention relates to an adhesion promoting layer which exhibits high temperature stability and high peel strengths when used in a multi-layer structure for a printed circuit board. More specifically, the present invention relates to an adhesion promoting layer for a multi-layer structure containing a first silane of the formula $$(Y-R)_a Si(X)_{4-a}$$

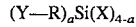

wherein a is 1 or 2, X is a hydrolyzable group, R is a hydrocarbon group and Y is a functional group selected from the group consisting of heterocyclic, acryloxy, amide and a carbon carbon double bond containing group, with the proviso that X and Y are not epoxy-containing groups and a second silane of the formula $$(GR)_b Si(K)_{4-b}$$

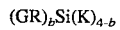

wherein b is 0, 1 or 2, K is individually an alkoxy, alkyl or halogen group, R is a hydrocarbon group and G is a functional group selected from an epoxy group and a glycidoxy group.

In another embodiment, the present invention relates to a multi-layer structure containing a prepreg layer wherein the prepreg is made from a resin curable via a carbon carbon double bond curing mechanism; and an adhesion promoting layer comprising a silane of the formula $$(Y\!-\!R)_a Si(X)_{4-a}$$

wherein a is 1 or 2, X is a hydrolyzable group, R is a hydrocarbon group and Y is a functional group selected from the group consisting of heterocyclic, acryloxy, amide and a carbon carbon double bond containing group, with the proviso that X and Y are not epoxy-containing groups.

In yet another embodiment, the present invention relates to a multi-layer structure containing a prepreg layer wherein the prepreg is made from a resin curable via a carbon carbon double bond curing process; and an adhesion promoting layer comprising a first silane and a second silane, the first silane represented by the formula $$(Y\!-\!R)_a Si(X)_{4-a}$$

wherein a is 1 or 2, X is a hydrolyzable group, R is a hydrocarbon group and Y is a functional group selected from the group consisting of heterocyclic, acryloxy, amide and a carbon carbon double bond containing group, with the proviso that X and Y are not epoxy-containing groups and the second silane represented by the formula $$(GR)_b Si(K)_{4-b}$$

wherein b is 0, 1 or 2, K is individually an alkoxy, alkyl or halogen group, R is a hydrocarbon group and G is a functional group selected from an epoxy group and a glycidoxy group.

In still another embodiment, the present invention relates to a multi-layer structure containing a metal foil layer; a prepreg layer wherein the prepreg layer is made from a resin curable via a carbon carbon double bond curing mechanism; and an adhesion promoting layer between the metal foil layer and the prepreg layer comprising a silane of the formula $$(Y\!-\!R)_a Si(X)_{4-a}$$

wherein a is 1 or 2, X is a hydrolyzable group, R is a hydrocarbon group and Y is a functional group selected from the group consisting of heterocyclic, acryloxy, amide and a carbon carbon double bond containing group, with the proviso that X and Y are not epoxy-containing groups.

In still yet another embodiment, the present invention relates to a multi-layer structure containing a metal foil layer; a prepreg layer wherein the prepreg is made from a resin curable via a carbon carbon double bond curing mechanism; and an adhesion promoting layer between the metal foil layer and the prepreg layer comprising a first silane and a second silane, the first silane represented by the formula $$(Y\!-\!R)_a Si(X)_{4-a}$$

wherein a is 1 or 2, X is a hydrolyzable group, R is a hydrocarbon group and Y is a functional group selected from the group consisting of heterocyclic, acryloxy, amide and a carbon carbon double bond containing group, with the proviso that X and Y are not epoxy-containing groups and the second silane represented by the formula $$(GR)_b Si(K)_{4-b}$$

wherein b is 0, 1 or 2, K is individually an alkoxy, alkyl or halogen group, R is a hydrocarbon group and G is a functional group selected from an epoxy group and a glycidoxy group.

DETAILED DESCRIPTION

The multi-layer structures according to the present invention contain at least two layers. In one embodiment, the multi-layer structure includes at least one prepreg layer and at least one adhesion promoting layer; or at least one metal foil layer and at least one adhesion promoting layer. In another embodiment, the multi-layer structure includes at least one metal foil layer, at least one prepreg layer, and at least one adhesion promoting layer. The multi-layer structures may further include at least one adhesive layer.

The multi-layer structures according to the present invention include a prepreg layer. Useful prepregs, sometimes referred to as dielectric substrates, may be prepared by impregnating woven glass, cellulose, paper sheets or other reinforcement materials with resins or partially cured resins.

Prepreg layer resins in accordance with the invention cure via a carbon carbon double bond curing mechanism. In other words, the molecules of the prepreg resins possess a polymerizable double bond. This mechanism is contrasted with resins that cure via the imidization of polyamic acids (imidization of acid and amide, acid and amine) or resins that cure by the reaction of epoxide groups. Examples of prepreg layer resins which cure via a carbon carbon double bond curing mechanism include polyimide, polyester cross-linked with a vinyl containing group (unsaturated polyester), silicon-carbon resins such as Sycar™ resins available from Hercules, as well as two or more thereof.

In one embodiment, a prepreg layer may be derived from a polyimide resin. In another embodiment, polyimide prepreg layers may be made from compounds other than methylene dianiline. A polyimide prepreg layer is also characterized by an absence of diamines such as methylene dianiline. In one embodiment, the polyimide resin is derived from a bismaleimide compound and a O,O'-diallyl bisphenol A compound. Bismaleimide compounds include, for example, 4-4'-bismaleimidodiphenylmethane. A polyimide curing via a carbon carbon double bond curing mechanism may be obtained by reacting 4-4'-bismaleimidodiphenylmethane with O,O'-diallyl bisphenol A. Specific examples include Araldite® XU 8292 NPM 60-1 and RD90-154 available from Ciba-Geigy. In another embodiment, the prepreg layer is characterized by the absence of epoxy groups.

In another embodiment, a prepreg layer may be derived from an unsaturated polyester such as a polyester cross-linked with a vinyl containing group. Vinyl containing groups include styrenes, substituted styrenes such as α-methylstyrene, divinylbenzene, diallylphthalate, methylmethacrylate, vinyltoluene and the like. Other unsaturated polyester resins are described in Reaction Polymers edited by Wilson F. Gum et al. and published by Hanser Publishers at pages 153 to 200, the relevant portion of which is hereby incorporated by reference. Curing agents for polyesters cross-linked with a vinyl containing group include peroxides such as benzoyl peroxide and methyl ethyl ketone peroxide. Additionally, an accelerator such as dimethyl aniline or cobalt naphthenate may be used.

The multi-layer structures of the present invention contain an adhesion promoting layer. The adhesion promoting layer may be located on one side of the metal foil layer or the prepreg layer. The adhesion promoting layer may also be located between the metal foil layer and the prepreg layer. In one embodiment, the adhesion promoting layer is characterized by the absence of chromium. The adhesion promoting layer contains a silane of Formula I:

$$(Y\text{—}R)_a Si(X)_{4-a} \quad (I)$$

wherein a is 1 or 2, X is a hydrolyzable group, R is a hydrocarbon group and Y is a functional group containing an activated double bond selected from the group consisting of heterocyclic, acryloxy, amide and a carbon carbon double bond containing group, with the proviso that X and Y are not epoxy-containing groups. Epoxy-containing groups are groups containing a

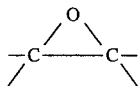

moiety. Hydrolyzable groups, which may contain from 1 to about 8 carbon atoms, preferably contain 1 to about 4 carbon atoms, Hydrolyzable groups also include halogens. For example, X includes hydrocarbyloxy and alkoxy groups such as methoxy, ethoxy, propyloxy and butoxy groups as well as chlorine, bromine, and iodine. Hydrocarbon groups include alkyl, alkenyl, or any other group substantially containing carbon and hydrogen atoms. In one embodiment, R is an alkyl group containing 1 to about 5 carbon atoms. In another embodiment, R is an alkyl group containing 1 to about 3 carbon atoms. In another embodiment, the silane is characterized by the absence of free amino groups.

Y is a functional group which must be compatible with the curing mechanism of the prepreg resin. Y is therefore selected from heterocyclic groups, acryloxy groups, amide groups and carbon carbon double bond containing groups. Examples of heterocyclic groups include substituted and unsubstituted pyrroles, pyrazoles, imidazoles, pyrrolidines, pyridines, pyrimidines, oxazoles, thiazoles, furans, thiophenes. Preferably, nitrogen containing heterocyclic groups are used. Preferably, heterocyclic groups having some degree of unsaturation are used. Examples of acryloxy groups include acryloxy, alkylacryloxy groups such as methacryloxy, and the like. Examples of carbon carbon double bond containing groups include alkenyl, cyclopentadienyl, styryl and phenyl.

Examples of silanes according to Formula 1 include N-(3-trimethoxysilylpropyl)pyrrole,
N-[3-(triethoxysilyl)propyl]-4,5-dihydroimidazole,
β-trimethoxysilylethyl-2-pyridine, N-phenylaminopropyltrimethoxysilane,
3-(N-styrylmethyl-2-aminoethylamino)propyltrimethoxysilane, methacryloxypropenyltrimethoxysilane,
3-methacryloxypropyltrimethoxysilane,
3-methacryloxypropyltris(methoxyethoxy)silane,
3-cyclopentadienylpropyltriethoxysilane, 7-oct-1-enyltrimethoxysilane, Prosil® 9214 from PCR, Inc. (a carboxy amide silane), and the like. Silanes such as N-[3-(triethoxysilyl)propyl]-4,5-dihydroimidazole and 3-methacryloxypropyltrimethoxysilane are preferred.

In one embodiment, the adhesion promoting layer contains the silane of Formula I as a first silane and a second silane represented by Formula II:

$$(GR)_b Si(K)_{4-b} + tm \quad (II)$$

wherein b is 0, 1 or 2, K is individually an alkoxy, alkyl or halogen group, R is a hydrocarbon group as defined above and G is a functional group selected from an epoxy group and a glycidoxy group. Individually means that two or more K substituents on the second silane may be different groups. For example, in the case where b is 1, two K substituents may be alkoxy groups while one K substituent may be an alkyl group. The alkoxy or alkyl group may contain 1 to about 8 carbon atoms, and preferably contains 1 to about 4 carbon atoms. In a more preferred embodiment, the alkoxy or alkyl group contains 1 to about 2 carbon atoms.

Preferred examples of silanes according to Formula II include tetramethoxysilane, tetraethoxysilane and 3-glycidoxypropyltrimethoxysilane. Other examples include tetrapropoxysilane, tetra-n-butoxysilane, γ-glycidoxypropylmethyldimethoxysilane,
γ-glycidoxypropylpylpentamethyldisiloxane, γ-glycidoxypropylmethyldiethoxysilane, γ-glycidoxypropyldimethylethoxysilane, (γ-glycidoxypropyl)-bis(trimethylsiloxy)methylsilane, and the like.

In an embodiment where a first and a second silane according to Formulae I and II are present in an adhesion promoting layer, any Formula I silane may be used with any Formula II silane. Examples of preferred combinations include N-[3-(triethoxysilyl)propyl]-4,5-dihydroimidazole and tetramethoxysilane; 3-methacryloxypropyltrimethoxysilane and tetramethoxysilane; N-[3-(triethoxysilyl)propyl]-4,5-dihydroimidazole and 3-glycidoxypropyl-trimethoxysilane; and 3-methacryloxypropyltrimethoxysilane and 3-glycidoxypropyltrimethoxysilane. Other examples include N-(3-trimethoxysilylpropyl)pyrrole and tetramethoxysilane; β-trimethoxysilylethyl-2-pyridine and γ-glycidoxypropylmethyldimethoxysilane; 3-(N-styrylmethyl-2-aminoethylamino)propyltrimethoxysilane and γ-glycidoxypropyl-methyldiethoxysilane; 3-cyclopentadienylpropyltriethoxysilane and γ-glycidoxypropyldimethylethoxysilane; and 7-oct-1-enyltrimethoxysilane and tetramethoxysilane.

In one embodiment, the adhesion promoting layer consists essentially of the first and second silanes according to Formulae I and II. In another embodiment where a first and a second silane according to Formulae I and II are present in an adhesion promoting layer, the ratio of the first silane to the second silane is about 5:95 to about 95:5, and preferably about 10:90 to about 90:10, in the adhesion promoting layer. In another embodiment, the ratio of the first silane to the second silane is about 20:80 to about 95:5 in the adhesion promoting layer. In a preferred embodiment, the ratio of the first silane to the second silane is about 80:20 to about 95:5.

The concentration of silane(s) present in a solvent prior to application is in the range of about 0.1% to about 5% by weight. Preferably, the concentration of the silane(s) in a solvent is in the range of about 0.5% to about 1.5% by weight. Suitable solvents include one or more of water and organic solvents such as alcohols, ketones, cellosolves, tetrahydrofuran, and the like. General methods of preparing silane deposition solutions are known to those skilled in the art.

The metal foil layer used with this invention contains one or more of aluminum, antimony, arsenic, chrome, chromium, cobalt, copper, gold, nickel, phosphorus, platinum, silver, solder, titanium, zinc and alloys thereof. In a preferred embodiment, the metal foil layer is copper or copper-based alloy foil. These metal foils are well known in the art and are made using one of at least two techniques. Wrought or rolled foil is produced by mechanically reducing the thickness of a copper or copper alloy strip or ingot by a process such as rolling. Electrodeposited metal foil is produced by electrolytically depositing metal ions on a rotating cathode drum and then peeling the deposited strip from the cathode. Electrodeposited copper foils are especially preferred.

The metal foils typically have nominal thicknesses ranging from about 0.0002 inch to about 0.02 inch. Foil thickness is sometimes expressed in terms of weight and typically the metal foils of the present invention have weights or thicknesses ranging from about ⅛ to about 14 oz/ft$^2$.

Electrodeposited metal foils have a smooth or shiny (drum) side and a rough or matte (metal deposit growth front) side. The inventive adhesion promoting layer can be adhered to either side of the foil and in some instances is adhered to both sides.

In one embodiment, the side or sides of the foil (electrodeposited or wrought) to which the adhesion promoting layer is adhered is a "standard-profile surface," "low-profile surface" or "very-low-profile surface." The term "standard-profile surface" is used herein to refer to a metal foil surface having an $R_{tm}$ of about 10 µm or less. The term "low-profile surface" refers to a metal foil surface having an $R_{tm}$ of about 7 µm or less. The term "very-low-profile surface" refers to a metal foil surface having an $R_{tm}$ of about 4 µm or less. $R_{tm}$ is the mean of the maximum peak-to-valley vertical measurement from each of five consecutive sampling measurements, and can be measured using a Surftronic 3 profilometer marketed by Rank Taylor Hobson, Ltd., Leicester, England.

Although the foils can be subjected to a surface roughening treatment prior to the application of the inventive adhesive, it is an advantage of the invention that desired adhesive characteristics for the multi-layer structure can be achieved without subjecting the metal foil to an added surface roughening treatment. Thus, in one embodiment of the invention, the metal foil is characterized by the absence of any added surface roughening treatment on the side or sides to which the adhesion promoting layer is adhered. The term "added surface roughening treatment" refers to any treatment performed on a base or raw metal foil that increases the roughness of the surface of the metal foil.

These treatments include copper deposited electrolytically in nodular or powder form, or copper oxide which grows nodular or dendritic. In one embodiment, mechanical roughness imparted to wrought metal foil during rolling or by subsequent abrasion which increases roughness beyond that of a standard profile surface is considered to be an added surface roughening treatment. In one embodiment, roughness imparted to an electrodeposited metal foil during electrodeposition which increases roughness beyond that of a standard profile surface is considered to be an added surface roughening. In one embodiment, any roughness imparted to the raw or base metal foil that increases the roughness of said foil beyond that of a standard profile surface is considered to be an added surface roughening treatment. In one embodiment, any roughness imparted to the raw or base metal foil that increases the roughness of said foil beyond that of a low-profile surface is considered an added surface roughening treatment. In one embodiment, any roughness imparted to the raw or base metal foil that increases the roughness of said foil beyond that of a very low-profile surface is considered an added surface roughening treatment.

In one embodiment, the side or sides of the base or raw metal foil to which the adhesion promoting layer is adhered is untreated prior to the application of the adhesion promoting layer to the metal foil. The term "untreated" is used herein to refer to raw or base foil that has not undergone subsequent treatment for the purpose of refining or enhancing the foil properties.

As indicated above, it is within the scope of the invention to apply to metal foils which have been subjected to an added surface roughening treatment the adhesion promoting layer. Thus, in one embodiment, one or both sides of the metal foil are treated with a roughened layer of copper or copper oxide prior to the application of the adhesion promoting layer. The copper can be deposited electrolytically in nodular or powder form. The copper oxide can grow nodular or dendritic.

In one embodiment, the side or sides of the base or raw metal foil to which the adhesion promoting layer is adhered is treated, prior to the application of the adhesion promoting layer with one or more surface treatment layers for the purpose of refining or enhancing the metal foil properties. Any side of the metal foil which does not have the adhesion promoting layer applied to it can, optionally, also have one or more of such treatment layers applied to it. These surface treatments are known in the art.

In one embodiment one or both sides of the metal foil are treated with at least one metallic layer, the metal in said metallic layer being selected from the group consisting of antimony, brass, bronze, cobalt, indium, nickel, tin, zinc and mixtures of two or more thereof, prior to the application of the adhesion promoting layer. Metallic layers of this type are in some instances referred to as barrier layers. These metallic layers preferably have thicknesses in the range of about 0.01 to about 1 micron, more preferably about 0.05 to about 0.1 micron.

In one embodiment one or both sides of the metal foil are treated with at least one metallic layer, the metal in said metallic layer being aluminum, antimony, arsenic, chromium, chromium-zinc alloy, molybdenum, nickel, phosphorus, tin, zinc, or a mixture of two or more thereof, prior to the application of the adhesion promoting layer. Metallic layers of this type are in some instances referred to as stabilization layers. These metallic layers preferably have thicknesses in the range of about 0.005 to about 0.05 micron, more preferably about 0.01 to about 0.02 micron.

In one embodiment, one or both sides of the metal foil are first treated with at least one barrier layer, then at least one stabilization layer, as discussed above, prior to the application of the adhesion promoting layer. In another embodiment, one or both sides of the metal foil are treated with at least one roughened layer of copper or copper oxide, then at least one barrier layer of the type discussed above prior to the application of the adhesion promoting layer. In one embodiment, one or both sides of the metal foil are treated with at least one roughened layer of copper or copper oxide, then at least one stabilization layer of the type discussed above is adhered to the layer of copper or copper oxide prior to the application of the adhesion promoting layer. In one embodiment, one or both sides of the metal foil are treated with at least one roughened layer of copper or copper oxide, then at least one barrier layer of the type discussed above is adhered to the roughened layer, then at least one stabilization layer is adhered to the barrier layer prior to the application of the adhesion promoting layer.

The adhesion promoting layer is adapted for enhancing adhesion between a metal foil layer and a prepreg layer. The adhesion promoting layer is applied to one or both sides of the metal foil, the metal foil surface to which the resulting adhesion promoting layer is applied being untreated or treated as discussed above. The adhesion promoting layer may be applied to the metal foil surface using known application methods which include reverse roller coating, doctor blade coating, dipping, painting and spraying. The process of applying the adhesion promoting layer may be repeated, if desired, several times.

The application of the adhesion promoting layer to the metal foil surface may be typically effected at a temperature of preferably about 15° C. to about 45° C., more preferably about 20° C. to about 30° C. Following application of the adhesion promoting layer to the metal foil surface, the adhesion promoting layer may be semi-cured (B-staged) by heating it to a temperature of preferably about 50° C. to about 200° C., and in one embodiment about 140° C. to 170° C., for preferably about 1 second to about 10 minutes, and in one embodiment about 5 seconds to about 5 minutes to enhance drying of the surface.

The metal copper foils with the B-staged adhesion promoting layer applied thereto generally have a matte-side roughness, $R_{tm}$, of about 2 to about 18 μm, and in one embodiment about 4 to about 11 μm, and in another embodiment about 5 to about 8 μm. In one embodiment of the invention, these foils have weights of about ½ ounce per square foot and the $R_{tm}$ of the matte side is about 2 to about 12 μm, or about 4 to about 8 μm. In one embodiment, these foils have weights of about 1 ounce per square foot and the $R_{tm}$ of the matte side is about 2 to about 16 μm, or about 5 to about 9 μm. In one embodiment, these foils have weights of about 2 ounces per square foot and the $R_{tm}$ of the matte side is about 6 to about 18 μm, or about 8 to about 11 μm. In one embodiment $R_{tm}$ for the shiny side of these foils is less than about 4 μm, or less than about 3 μm, or is in the range of about 1.5 to about 3 μm, or about 2 to about 2.5 μm.

The metal foils with the B-staged adhesion promoting layer applied thereto can be bonded to one or more prepreg layers. The adhesion promoting layer enhances the bond or peel strength between the metal foil layer and the prepreg layer. An advantage of the metal foils is that the foils can avoid the application of any added surface roughening, yet exhibit effective bond or peel strength with prepreg layers. The foils can have a standard profile surface, low-profile surface and even a very low-profile surface, and yet provide acceptable peel strengths. With the metal foils, either the matte side or shiny side can be effectively bonded to a prepreg layer.

Alternatively, the adhesion promoting layer is applied to one or both sides of the prepreg layer. The adhesion promoting layer may be applied to the prepreg surface using known application methods which include reverse roller coating, doctor blade coating, dipping, painting and spraying. The application process may be repeated, if desired, several times.

In preparing certain embodiments of the multi-layer structure, it is useful for both the prepreg layer and the metal foil layer to be provided in the form of long webs of material rolled up in rolls. The rolled materials are drawn off the rolls and cut into rectangular sheets. The rectangular sheets are then laid-up or assembled in stacks of assemblages. Each assemblage may comprise one or more prepreg sheets with a sheet of foil on either side thereof or on one side, and in each instance, the side (or one of the sides) of the metal foil sheet with the adhesion promoting layer adhered thereto is positioned adjacent the prepreg.

The multi-layer structure may be subjected to conventional laminating temperatures and pressures between the plates of laminating presses to prepare laminates comprising sandwiches of a sheet or sheets of prepreg between sheets of metal foil. Alternatively, a continuous lamination process may be used where the metal foil and prepreg are unrolled and passed through a heated press as a continuous web and cut into sheets afterwards.

By application of heat and pressure, the metal foil layer is pressed tightly against the prepreg layer and the temperature to which the multi-layer structure is subjected activates the resin to cause curing; that is, cross-linking of the resin and thus tight bonding of the metal foil layer to the prepreg layer. Generally speaking, the laminating operation will involve pressures in the range from about 30 to about 1000 psi, temperatures in the range from about 150° C. to about 250° C. and a laminating cycle in the range from about 50 minutes to about 6 hours. In one embodiment, a continuous lamination process is used under a vacuum or no added pressure is used, the temperature is up to about 200° C., and the lamination time is less than about 30 minutes. The resultant laminate may then be utilized to prepare printed circuit boards (PCB).

The resultant laminate may be subjected to a subtractive metal etching process to form electrically conductive lines or an electrically conductive pattern as part of a process for making a multilayered circuit board. A second adhesion promoting layer may then be applied over the etched pattern using the techniques discussed above and then a second prepreg layer adhered to the etched pattern after a second adhesion-promoting layer is positioned between and adhered to both the etched pattern and the second prepreg layer. The techniques for making multilayered circuit boards are well known in the art. Similarly, subtractive etching processes are well known, an example of which is disclosed in U.S. Pat. No. 5,017,271, which is incorporated herein by reference.

A number of manufacturing methods are available for preparing PCBs from laminates. Additionally, there is a myriad of possible end use applications for the PCBs including radios, televisions, VCRs computers, etc. These methods and end uses are known in the art.

The following examples are provided for purposes of illustrating the invention. Unless otherwise indicated, in the following example as well as throughout the specification and claims, all parts and percentages are by weight, all temperatures are in degrees centigrade, and all pressures are atmospheric.

EXAMPLE 1

A solution is prepared by combining one part N-phenylaminopropyltrimethoxysilane with 40 parts ethanol and 60 parts water and stirred for up to four hours. The resultant solution is applied to copper foil by either spraying or dipping. Excess solution may be removed by squeegee, if necessary. The coated foil is dried in an oven for about 30 seconds at 100° C. The resultant coated copper foil is laminated at about 40 psi for about 90 minutes at about 225° C. to a polyimide prepreg made from 4-4'-bismaleimidodiphenylmethane reacted with O,O'-diallyl bisphenol A.

EXAMPLE 2

A solution is prepared by combining one part N-[3-(triethoxysilyl)propyl]-4,5-dihydroimidazole with 99 parts water and stirred for up to four hours. The resultant solution is applied to copper foil by either spraying or dipping. Excess solution may be removed by squeegee, if necessary. The coated foil is dried in an oven for about 30 seconds at 100° C. The resultant coated copper foil is laminated at about 40 psi for about 90 minutes at about 225° C. to a polyimide prepreg made from 4-4'-bismaleimidodiphenylmethane reacted with O,O'-diallyl bisphenol A.

EXAMPLE 3

A solution is prepared by combining one part β-trimethoxy-silylethyl-2-pyridine with 99 parts water and stirred for up to four hours. The resultant solution is applied to copper foil by either spraying or dipping. Excess solution may be removed by squeegee, if necessary. The coated foil is dried in an oven for about 30 seconds at 100° C. The resultant coated copper foil is laminated at about 40 psi for about 90 minutes at about 225° C. to a polyimide prepreg made from 4-4'-bismaleimidodiphenylmethane reacted with O,O'-diallyl bisphenol A.

EXAMPLE 4

A solution is prepared by combining one part 3-(N-styrylmethyl-2-aminoethylamino)propyltrimethoxysilane with 99 parts water and stirred for up to four hours. The resultant solution is applied to copper foil by either spraying or dipping. Excess solution may be removed by squeegee, if necessary. The coated foil is dried in an oven for about 30 seconds at 100° C. The resultant coated copper foil is laminated at about 40 psi for about 90 minutes at about 225° C. to a polyimide prepreg made from 4-4'-bismaleimidodiphenylmethane reacted with O,O'-diallyl bisphenol A.

EXAMPLE 5

A solution is prepared by combining one part Prosil® 9214 from PCR, Inc. with 99 parts water and stirred for up to four hours. The resultant solution is applied to copper foil by either spraying or dipping. Excess solution may be removed by squeegee, if necessary. The coated foil is dried in an oven for about 30 seconds at 100° C. The resultant coated copper foil is laminated at about 40 psi for about 90 minutes at about 225° C. to a polyimide prepreg made from 4-4'-bismaleimidodiphenylmethane reacted with O,O'-diallyl bisphenol A.

EXAMPLE 6

A solution is prepared by combining 0.8 parts of N-[3-(triethoxysilyl)propyl]-4, 5-dihydroimidazole, 0.2 parts tetramethoxysilane with 99 parts water and stirred for up to four hours. The resultant solution is applied to copper foil by either spraying or dipping. Excess solution may be removed by squeegee, if necessary. The coated foil is dried in an oven for about 30 seconds at 100° C. The resultant coated copper foil is laminated at about 40 psi for about 90 minutes at about 225° C. to a polyimide prepreg made from 4-4'-bismaleimidodiphenylmethane reacted with O,O'-diallyl bisphenol A.

EXAMPLE 7

A solution is prepared by combining 0.7 parts of N-(3-trimethoxysilylpropyl)pyrrole, 0.3 parts γ-glycidoxypropylmethyldimethoxysilane with 99 parts water and stirred for up to four hours. The resultant solution is applied to copper foil by either spraying or dipping. Excess solution may be removed by squeegee, if necessary. The coated foil is dried in an oven for about 30 seconds at 100° C. The resultant coated copper foil is laminated at about 40 psi for about 90 minutes at about 225° C. to a prepreg made from a Sycar™ silicon-carbon resin.

EXAMPLE 8

A solution is prepared by combining 0.6 parts of 3-cyclopentadienylpropyltriethoxysilane, 0.4 parts tetraethoxysilane with 99 parts water and stirred for up to four hours. The resultant solution is applied to copper foil by either spraying or dipping. Excess solution may be removed by squeegee, if necessary. The coated foil is dried in an oven for about 30 seconds at 100° C. The resultant coated copper foil is laminated at about 40 psi for about 90 minutes at about 225° C. to a prepreg made from a Sycar™ silicon-carbon resin.

EXAMPLE 9

A solution is prepared by combining 0.2 parts of N-[3-(triethoxysilyl)propyl]-4,5-dihydroimidazole, 0.8 parts of glycidopropyltrimethoxysilane with 199 parts water and stirred for up to four hours. The resultant solution is applied to copper foil by either spraying or dipping. Excess solution may be removed by squeegee, if necessary. The coated foil is dried in an oven for about 30 seconds at 100° C. The resultant coated copper foil is laminated at about 40 psi for about 90 minutes at about 225° C. to a polyimide prepreg made from 4-4'-bismaleimidodiphenylmethane reacted with O,O'-diallyl bisphenol A.

EXAMPLE 10

A solution is prepared by combining 0.2 parts of N-[3-(triethoxysilyl)propyl]-4,5-dihydroimidazole, 0.8 parts of tetramethoxysilane with 199 parts water and stirred for up to four hours. The resultant solution is applied to copper foil by either spraying or dipping. Excess solution may be removed by squeegee, if necessary. The coated foil is dried in an oven for about 30 seconds at 100° C. The resultant coated copper foil is laminated at about 40 psi for about 90 minutes at about 225° C. to a polyimide prepreg made from 4-4'-bismaleimidodiphenylmethane reacted with O,O'-diallyl bisphenol A.

TABLE 1

| Adhesion Promoting Layer | Peel Strength in lbs/in$^2$ after Solder Exposure | |
|---|---|---|
| | Polyimide Prepreg made from Compounds Curing Reaction of a Diamine with a Bismaleimide | Polyimide Prepreg made from Compounds Having a Carbon Carbon Double Bond Curing Mechanism |
| 3-glycidoxypropyltrimethoxysilane | 11.18 | 6.96 |
| N-[3-(triethoxysilyl)propyl]-4,5-dihydroimidazole | 10.30 | 9.49 |
| 80% N-[3-(triethoxysilyl)propyl]-4,5-dihydroimidazole 20% tetramethoxysilane | 11.10 | 9.68 |
| 80% methacryloxypropyltrimethoxysilane 20% tetramethoxysilane | 11.21 | 8.32 |

Table 1 above represents a comparison between the adhesion strength to different prepreg layers. Each of the four adhesion promoting layers is applied to copper foil, and then laminated to the two prepreg layers described above. More specifically, for the laminates containing polyimide prepregs made from compounds curing via a diamine with a bismaleimide, one part of each of the compounds (or combination of compounds) in the left column are mixed with 99 parts water, then applied to the matte side of electrodeposited copper foil. The coated foils are then laminated to 4 plies of prepreg at 250 psi pressure, heated to 225° C., and held together for about 2 hours, followed by cooling to room temperature. The laminates are post baked for one hour at 225° C. For the laminates containing polyimide prepregs made from compounds having a carbon carbon double bond curing mechanism, one part of each of the compounds (or combination of compounds) in the left column are mixed with 99 parts water, then applied to the matte side of electrodeposited copper foil. The coated foils are then laminated to 4 plies of prepreg at 40 psi pressure, heated to 225° C., and held together for about 1.5 hours, followed by cooling to room temperature. All of the laminates are imaged and etched to give about 0.125 inch lines which are peeled as in the After Thermal Stress section of 2.4.8 of the IPC Test Methods Manual.

While the invention has been explained in relation to its preferred embodiments, it is to be understood that various modifications thereof will become apparent to those skilled in the art upon reading the specification. Therefore, it is to be understood that the invention disclosed herein is intended to cover such modifications as fall within the scope of the appended claims.

We claim:

1. A multi-layer structure, comprising:
   a metal foil layer;
   a prepreg layer wherein the prepreg layer is made from a resin curable via a carbon carbon double bond curing mechanism; and
   an adhesion promoting layer between the metal foil layer and the prepreg layer comprising a silane of the formula $(Y-R)_a Si(X)_{4-a}$ wherein a is 1 or 2, X is a hydrolyzable group, R is a hydrocarbon group and Y is a functional group selected from the group consisting of heterocyclic, amide and a styryl containing group, with the proviso that X and Y are not epoxy-containing groups.

2. The multi-layer structure of claim 1, wherein the metal foil layer comprises copper or a copper alloy.

3. The multi-layer structure of claim 1, wherein the metal foil layer underlying the adhesion promoting layer comprises a metallic layer of aluminum, antimony, arsenic, chromium, cobalt, indium, molybdenum, nickel, phosphorus, tin, zinc or a mixture of two or more thereof.

4. The multi-layer structure of claim 2, wherein the metal foil layer underlying the adhesion promoting layer comprises a metallic layer of aluminum, antimony, arsenic, chromium, cobalt, indium, molybdenum, nickel, phosphorus, tin, zinc or a mixture of two or more thereof.

5. The multi-layer structure of claim 2, wherein the prepreg layer comprises a polyimide resin made by the reaction of a bismaleimide compound and an O,O'-diallyl bisphenol A compound.

6. The multi-layer structure according to claim 1, wherein the prepreg layer is characterized by the absence of epoxy groups.

7. The multi-layer structure according to claim 1, wherein X is an alkoxy group.

8. The multi-layer structure according to claim 1, wherein R is an alkyl group containing 1 to about 5 carbon atoms.

9. The multi-layer structure according to claim 1, wherein Y is a heterocyclic group or an acryloxy group.

10. The multi-layer structure according to claim 1, wherein a is 1, X is an alkoxy group containing 1 to about 4 carbon atoms, and Y is a functional group selected from a heterocyclic group or an acryloxy group.

11. A multi-layer structure, comprising:
    a metal foil layer;
    a prepreg layer wherein the prepreg layer is made from a resin curable via a carbon carbon double bond curing mechanism, the prepreg layer is at least one of a polyimide resin made by the reaction of a bismaleimide compound and an O,O'-diallyl bisphenol A compound, a polyester cross-linked with a vinyl containing group, or a silicon-carbon resin; and
    an adhesion promoting layer between the metal foil layer and the prepreg layer comprising a silane of the formula $(Y-R)_a Si(X)_{4-a}$ wherein a is 1 or 2, X is a hydrolyzable group, R is a hydrocarbon group and Y is a functional group selected from the group consisting of heterocyclic, amide and a styryl containing group, with the proviso that X and Y are not epoxy-containing groups.

12. A multi-layer structure, comprising:
    a metal foil layer;
    a prepreg layer wherein the prepreg layer is made from a resin curable via a carbon carbon double bond curing mechanism, the prepreg layer is at least one of a polyimide resin made by the reaction of a bismaleimide compound and an O,O'-diallyl bisphenol A compound, a polyester cross-linked with a vinyl containing group, or a silicon-carbon resin; and
    an adhesion promoting layer between the metal foil layer and the prepreg layer comprising a silane of the formula $(Y-R)_a Si(X)_{4-a}$ wherein a is 1 or 2, X is a hydrolyzable group, R is a hydrocarbon group and Y is a heterocyclic group, with the proviso that X and Y are not epoxy-containing groups.

13. A multi-layer structure, comprising:
    a metal foil layer;
    a prepreg layer wherein the prepreg layer is made from a polyimide resin made by the reaction of a bismaleimide compound and an O,O'-diallyl bisphenol A compound; and
    an adhesion promoting layer between the metal foil layer and the prepreg layer comprising a silane of the formula $(Y-R)_a Si(X)_{4-a}$ wherein a is 1 or 2, X is a hydrolyzable group, R is a hydrocarbon group and Y is a functional group selected from the group consisting of heterocyclic, amide and a styryl containing group, with the proviso that X and Y are not epoxy-containing groups.

14. The multi-layer structure of claim 13, wherein the metal foil layer comprises copper or a copper alloy.

15. The multi-layer structure of claim 13, wherein the metal foil layer underlying the adhesion promoting layer comprises a metallic layer of aluminum, antimony, arsenic, chromium, cobalt, indium, molybdenum, nickel, phosphorus, tin, zinc or a mixture of two or more thereof.

16. The multi-layer structure of claim 14, wherein the metal foil layer underlying the adhesion promoting layer comprises a metallic layer of aluminum, antimony, arsenic, chromium, cobalt, indium, molybdenum, nickel, phosphorus, tin, zinc or a mixture of two or more thereof.

17. The multi-layer structure according to claim 13, wherein the prepreg layer is characterized by the absence of epoxy groups.

18. The multi-layer structure according to claim 13, wherein X is an alkoxy group.

19. The multi-layer structure according to claim 13, wherein R is an alkyl group containing 1 to about 5 carbon atoms.

20. The multi-layer structure according to claim 13, wherein a is 1, X is an alkoxy group containing 1 to about 4 carbon atoms, and Y is a heterocyclic group.

* * * * *